(12) United States Patent
Bircher et al.

(10) Patent No.: US 12,603,250 B2
(45) Date of Patent: Apr. 14, 2026

(54) MULTICELL OR MULTIARRAY PLASMA AND METHOD FOR SURFACE TREATMENT USING THE SAME

(71) Applicants: INSTITUT SYSTÈMES INDUSTRIELS, HAUTE ECOLE DE SUISSE OCCIDENTALE, VALAIS-WALLIS (HES-SO), Sion (CH); IPRINT INSTITUTE, Marly (CH)

(72) Inventors: Fritz Bircher, Madiswil (CH); Christoph Ellert, Sion (CH); Alain Germanier, Sion (CH); David Martinet, Mollens (CH); Gilbert Gugler, Marly (CH); Sebastian Filliger, Naters (CH)

(73) Assignees: INSTITUT SYSTÈMES INDUSTRIELS, HAUTE ECOLE DE SUISSE OCCIDENTALE, VALAIS-WALLIS (HES-SO), Sion (CH); IPRINT INSTITUTE, Marly (CH)

( * ) Notice: Subject to any disclaimer, the term of this patent is extended or adjusted under 35 U.S.C. 154(b) by 642 days.

(21) Appl. No.: 18/023,900

(22) PCT Filed: Aug. 20, 2021

(86) PCT No.: PCT/IB2021/057671
§ 371 (c)(1),
(2) Date: Feb. 28, 2023

(87) PCT Pub. No.: WO2022/049445
PCT Pub. Date: Mar. 10, 2022

(65) Prior Publication Data
US 2023/0360888 A1 Nov. 9, 2023

(30) Foreign Application Priority Data

Sep. 2, 2020 (EP) ...................................... 20194025

(51) Int. Cl.
*H01J 37/32* (2006.01)

(52) U.S. Cl.
CPC .... *H01J 37/32366* (2013.01); *H01J 37/3244* (2013.01); *H01J 37/32477* (2013.01); *H01J 37/32568* (2013.01); *H01J 2237/336* (2013.01)

(58) Field of Classification Search
CPC ............ H01J 37/32366; H01J 37/3244; H01J 37/32477; H01J 37/32568;
(Continued)

(56) References Cited

U.S. PATENT DOCUMENTS 4,301,391 A * 11/1981 Seliger .................... H01J 37/08
                                           315/111.21
6,528,947 B1 3/2003 Chen et al.
(Continued)

FOREIGN PATENT DOCUMENTS

JP        2004-353066        12/2004

OTHER PUBLICATIONS

International Search Report for PCT/IB2021/057671, dated Oct. 27, 2021, 4 pages.
Written Opinion of the ISA for PCT/IB2021/057671, dated Oct. 27, 2021, 8 pages.

*Primary Examiner* — Joshua L Allen
*Assistant Examiner* — Christopher Remavege
(74) *Attorney, Agent, or Firm* — NIXON & VANDERHYE

(57) ABSTRACT

Disclosed is a plasma device including at least two plasma cells, and a command unit, wherein the first and the second electrodes of a given plasma cell are independent from the corresponding first and second electrodes of the contiguous
(Continued)

plasma cells. The electrodes of contiguous plasma cells are independently connected to the command unit. The command unit includes a high voltage generator and a radiofrequency generator which are mutually protected by a filtering element.

19 Claims, 4 Drawing Sheets

(58) Field of Classification Search
CPC ........... H01J 2237/336; H01J 37/32027; H01J 37/32825; H01J 37/32899; H01J 37/32073; H05H 2242/26; H05H 1/466; H05H 1/48
See application file for complete search history.

(56) References Cited

U.S. PATENT DOCUMENTS

| | | | |
|---|---|---|---|
| 2009/0236314 A1* | 9/2009 | Chen ................. | H01J 37/32357 |
| | | | 156/345.33 |
| 2010/0308730 A1 | 12/2010 | Mohamed et al. | |
| 2011/0031216 A1* | 2/2011 | Liao ................. | H01L 21/31116 |
| | | | 216/67 |
| 2016/0109863 A1* | 4/2016 | Valcore, Jr. ............ | G06F 30/20 |
| | | | 703/2 |
| 2016/0280608 A1 | 9/2016 | Foret | |
| 2018/0122624 A1 | 5/2018 | Hughlett et al. | |
| 2021/0319979 A1* | 10/2021 | Uhm ...................... | H01J 37/32 |
| 2024/0096598 A1* | 3/2024 | Kapoor ............. | G01N 21/9501 |

* cited by examiner

MULTICELL OR MULTIARRAY PLASMA AND METHOD FOR SURFACE TREATMENT USING THE SAME

This application is the U.S. national phase of International Application No. PCT/IB2021/057671 filed Aug. 20, 2021 which designated the U.S. and claims priority to EP 20194025.1 filed Sep. 2, 2020, the entire contents of each of which are hereby incorporated by reference.

TECHNICAL FIELD

The present invention relates to a method for treating surfaces using a plasma, with a high definition, as well as the plasma device used therefore. More particularly, the plasma device comprises several plasma cells arranged in arrays and adapted to be individually piloted. The present invention also relates to a specific command circuit adapted for precisely and independently command the plasma cells.

STATE OF THE ART

Plasma is already known for a while to treat surfaces and modify their surface tension or their surface properties. Plasma is for example used to modify surface composition or surface structure, for layer deposition or for partial removal of material. Treating surfaces with a plasma is for example a well known step before applying a paint, an ink, an adhesive or any other material, which would otherwise not reliably adhere on the surface. The materials having a low surface tension are generally subjected to plasma treatment so as to increase their surface tension and allow a better adhesion of an additional layer of material.

Several types of plasma have been developed so far, including atmospheric or air plasma, flame plasma, atmospheric chemical plasma. In practice, a gas is supplied through two high voltage electrodes so as to generate ionized species, and directed toward the surface to be treated. Most plasma applications involve a continuous supply of the ionised species onto the surface in such a manner that a large surface is covered. The plasma source having a small surface, some devices use rotative heads in such a way that a larger surface can be treated.

Independently on their specificities, the above plasma devices are designed to continuously provide a plasma and applied to large surfaces. They are however not adapted to be precisely directed to small areas of the surfaces. They are in addition designed for a continuous and regular application and thus not adapted for fast on/off cycles. In particular, due to the high voltage used for the plasma generation, fast and precise control is tedious. The high voltage is usually not adapted for a fast activation and deactivation of a plasma cell.

Some arrays of plasma cells have also been developed, such as those described in U.S. Pat. No. 6,528,947. This document describes a cathode assembly comprising a plurality of cells to provide a uniform plasma. Although the plasma is delivered through several cells instead of one, this kind of devices suffers from the same drawbacks as above-mentioned regarding the local treatment of surfaces. In particular, all the plasma cells are activated at the same time and cover a large surface area.

In addition, the treatment of surface with plasma usually necessitates vacuum. This requires at least a pump and closed environment, as well as expensive equipment surrounding the plasma device.

In the industry, surface treatment is widely used for coatings or paints. The surface treatment can however not be used for marking pieces or drawing two dimension representations on the surfaces due to their low definition and accuracy. It is rather necessary to include an ink jet step for the purpose of marking the manufactured objects, which may come in addition to the treatment step with a plasma.

There is thus a need to further develop the plasma devices and method of use.

SUMMARY OF THE INVENTION

An object of the present invention is to provide a plasma device allowing to modify the surfaces with two dimensional motives. In particular, an object of the present invention is to provide a plasma device allowing for printing, for etching, for material deposition, for surface colorshift, for decontamination, or for cleaning, or for a combination of two or more of these surface transformations.

Another object of the present invention is to provide a plasma device directly usable as a 2D printing device on surfaces.

It is a further object of the present invention to provide a multicell or a multiarray plasma cell device, wherein the plasma cells can be individually and independently activated. The term "multi-cell" denotes an array, comprising a plurality of individual cells. The term "multi-array" denotes a plurality of arrays, each comprising a plurality of individual cells.

It is another object of the present invention to provide a multicell or a multiarray plasma cell device allowing a fast and precise control of each of the plasma cells independently. It is in particular an object to provide a control mean adapted to generate a plasma in a quick and precise manner independently in individual cells of a multicell or a multiarray plasma cell device.

It is also an object of the present invention to provide a control method for a multicell or a multiarray plasma cell device, for 2D printing operations.

It is also an object of the present invention to allow printing surfaces in a convenient and inexpensive manner. It is in particular an object of the present invention to allow printing surfaces with a multicell or a multi-array plasma device without vacuum generation. Absence of vacuum generation means that the printing of the surface occurs at the atmospheric pressure. It is also an object of the present invention to allow printing surfaces with a multicell or a multi-array plasma device under moderate vacuum. Moderate vacuum denotes a pressure slightly below the atmospheric pressure, such as comprised between around 1 bar and around 800 mbars, or between around 1 bar and around 500 mbars, or between around 1 bar and around 100 mbars.

It is an object of the present invention to provide a surface treatment wherein the surface treatment denotes one or more of the modification of the surface properties, such as the surface tension, the addition of material, such as a deposition, and removal of material such as etching, such surface treatment being localised and/or allowing patterning on the surface.

These objects are realized by means of the device and the method defined in the independent claims, and further detailed by the dependent claims.

The claimed invention thus advantageously allows to quickly and precisely draw 2d marking on the surfaces.

DESCRIPTION OF THE DRAWINGS

Examples and embodiments of the present invention are below explained in more details with the help of the following drawings.

DETAILED DESCRIPTION OF THE INVENTION

Figure 1:
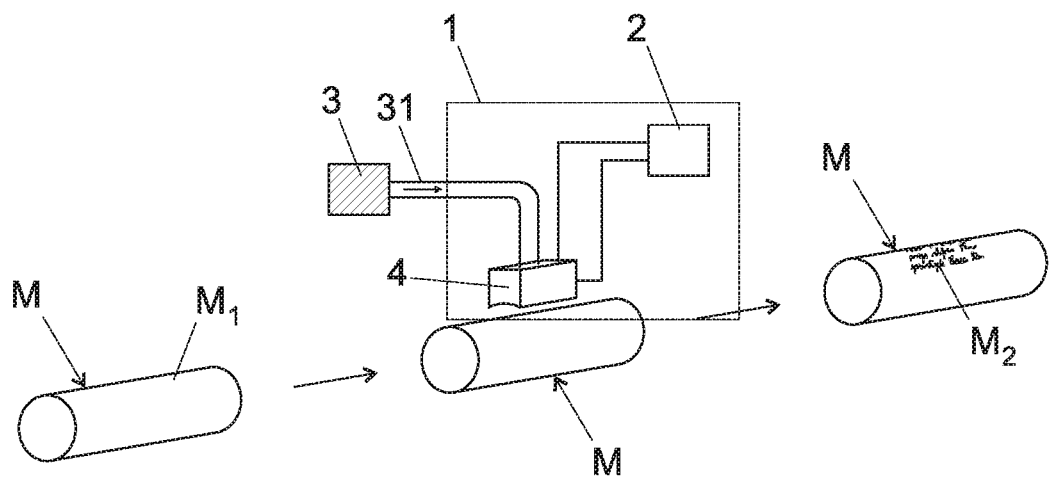
FIG. 1: Schematic diagram showing the marking process with a multicell plasma device according to the present invention.
Figure 2:
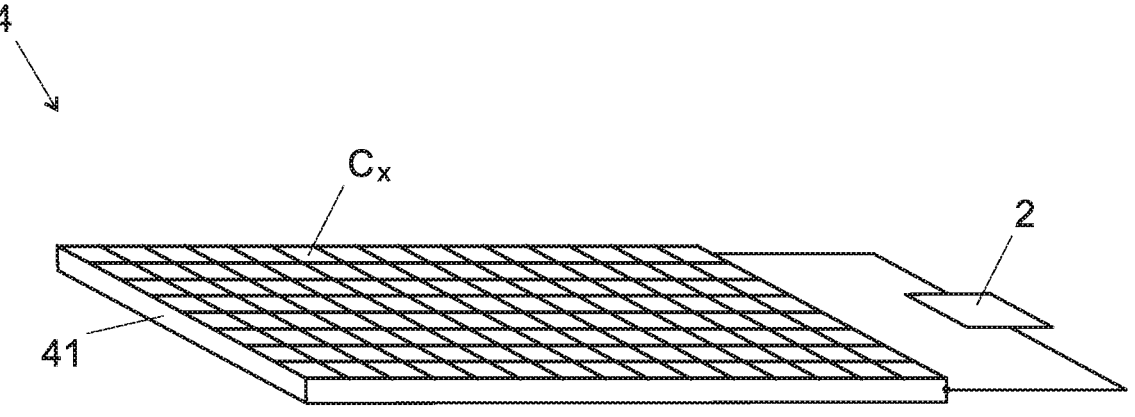
FIG. 2: Details of an array of plasma cells

As shown in FIG. 1, a manufactured object M having at least one surface M1 may be object of a surface treatment using the plasma device 1. The treatment of the surface M1 results on a mark M2 located at a predetermined area of the surface M. The surface M1 of the object M may be done of any material, including material having low surface tension. It may be of glass, of synthetic polymer, of metal such as iron, stainless steel or of a metallic alloy. The mark M2 provided on the surface may be any kind of 2D representation, including letters, numbers, geometrical figures, or any other inscription. The surface M1 is thus treated so as to locally modify its properties, and in particular its surface tension, or locally add or remove material so as to provide a pattern. The marking process using the plasma device 1 may be done inline, in the flow of the production or step by step, after the manufactured object has been immobilized for a short period of time. The step by step approach may be used as a batch process.

For the purpose of the present invention, the term "surface treatment" denotes the modification the physical properties of the treated surface, and in particular its surface tension, its wettability and/or its polarity. The surface treatment thus induces a direct change of the material of the treated surface, like an oxidation. It also includes where applicable a local coating or material deposition such a chemical product. Such product deposition may be concomitant to the physical change of the surface or not. The deposited product locally provides different surfaces tension, wettability and/or polarity of the treated surface. Alternatively, the deposited product in itself has different properties than the surface on which it is deposited. The surface treatment also includes the removal of material, also commonly known as etching.

The plasma device 1 comprises a head 4 arranged in a manner to be placed at close proximity of the surface M1 to be treated. This head 4 comprises several plasma cells Cx, each of these plasma cells being adapted to generate a plasma Px once activated by a control unit 2. The control unit allows to supply a voltage Vx to each plasma cell Cx of the head 4, independently. In particular, the control unit 2 allows to supply a time varying voltage or an intermittent voltage, or a combination thereon. The plasma device 1 also comprises a plasma precursor unit 3, which is connected to each of the cells Cx by a pipe 31, so has to inject through the cells the plasma precursor.

The plasma precursor may be any material usable to provide a plasma. It can be a gas such as oxygen, a mixture of gas, a solution comprising one or several components, or a mixture of gas and vaporised components. The plasma precursor may in addition or alternatively comprise aerosols. The plasma precursor unit 3 comprises one or several tanks adapted to store the plasma precursor, either separately when applicable or together. Such a tank includes gas bottle or gas supply line. Such a tank thus denotes any suitable reservoir adapted to store the plasma precursor, whether it is liquid or gaseous. The plasma precursor unit 3 may also comprise an aerosol generator.

The plasma precursor is supplied to the cells Cx of the head 4 to one of their end so as to be expelled at their opposite end toward the surface M1 to be treated. Meanwhile a high voltage Vx is applied to the electrodes of the cells Cx from which a plasma is required for a time Tx, referenced as an ignition duration for a given cell. In the references Cx and Tx, x denotes an integer comprised between 1 and 10000 or more, preferably between 10 and 1000 and corresponds to the rank of a given cell Cx. In other words, the number of plasma cells may be as high as necessary, such a 10, 100, 1000, 10000 or higher. The plasma device 1 is thus preferably a multicell plasma, wherein the plasma cells Cx are contiguous to each other and organised in lines or in clusters or in arrays. Other geometrical arrangement of the cells may be envisaged. The plasma cells may preferably be organized in one or several parallel lines each comprising between 2 and 200, between 20 and 200 or between 20 and 2000 plasma cells. The plasma cells may be arranged in several arrays or cluster, thus providing a multi-array arrangement.

For the purpose of the 2D printing operation, each of the plasma cells Cx may be individually and independently activated, meaning that a plasma Px is independently generated cell by cell and for independent ignition time Tx. To this end, each cell of the device 1 comprise independent electrodes E1, E2.

The plasma device 1 may comprise one plasma cell only, such a plasma cell being switch on and off, by the mean of the command unit 2, at different times and for different durations. The successive ignition and stop of the plasma, while a relative move between the head 4 and the surface M1 to be treated occurs, allows to print a predetermined figure M2 on the surface. This however may need both lateral and longitudinal move of the head 4 with respect to the surface M1 to be treated. This is time consuming and necessitates the adequate mechanical arrangement. The plasma device 1 thus preferably comprises several cells Cx in a row. In such a way, a relative move between the head 4 and the surface M1 to be treated may be necessary in only one direction. When the row of plasma cells Cx is transversal to the moving direction of the surface M1 to be treated, the successive individual activation of the plasma cells Cx allows a 2d marking. The more plasma cells are arranged, the faster will be the printing operations. When the plasma cells Cx are arranged in an array, it may even be possible to print the surface M1 without relative move between the object M and the head 4. A move of the head 4, comprising several plasma cells organised in an array, relatively to the object M may still be possible so as to print several different 2D representations at several areas of a given object M. It should thus be understood that the number of plasma cells Cx, their relative arrangement and the relative moves of the head 4 and the object M may be adapted to the needs without departing from the present invention.

Figure 3:
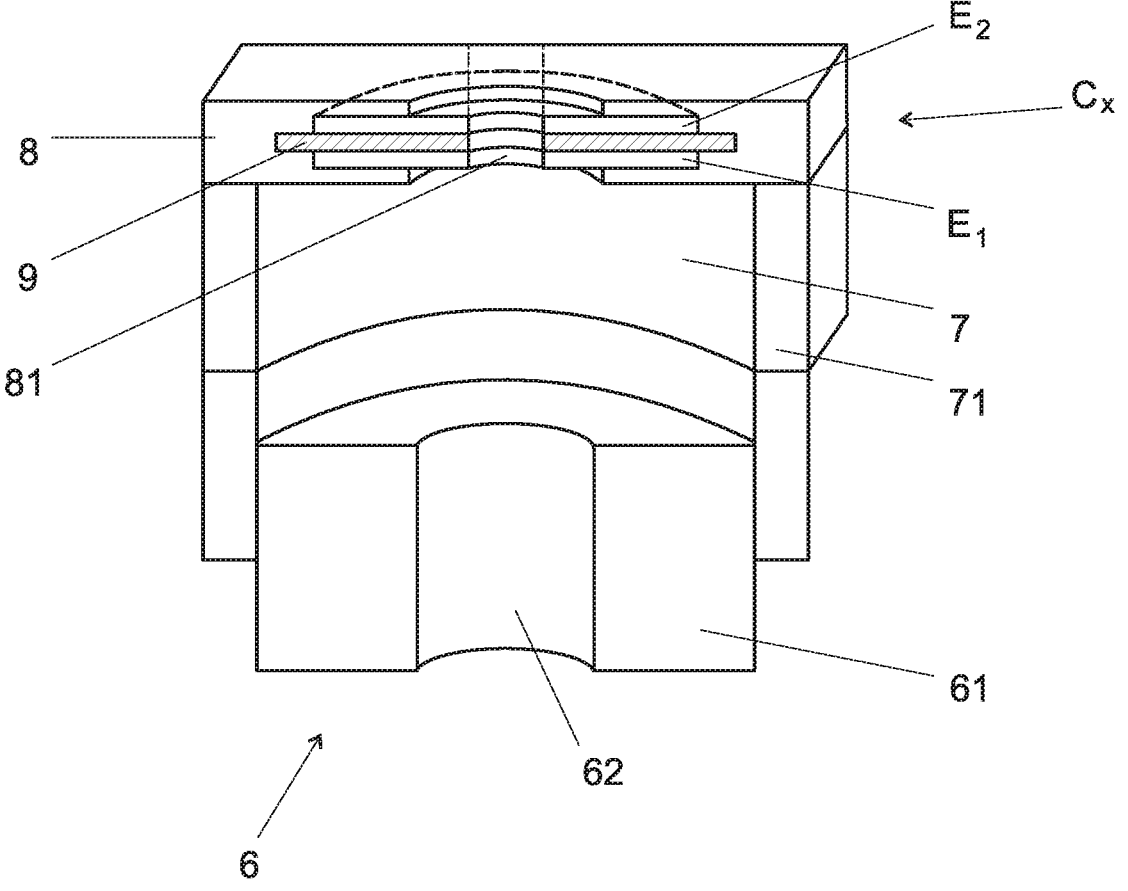
FIG. 3: Details of a given plasma cell.

FIG. 3 shows the details of a given plasma cell Cx. Each of the plasma cells Cx of the head comprises a gas inlet 6, having a core 61 and a central trough hole 62. The gas inlet 6 is placed at the rear end of the plasma cell Cx and allows to feed the plasma cell with the plasma precursor. The through hole 62 is connected to the internal chamber 7 of the plasma cell Cx. The internal chamber is delimited by a lateral wall 71. Such a lateral wall 71 may by of any shape, such as circular, ellipsoid, square, rectangular, hexagonal or polygonal. Opposite to the gas inlet 6 with respect to the internal chamber 7, the plasma cell comprises a front wall 8 having a front opening 81 through which the gas can flow from the internal chamber 7 to outside the plasma cell. The front opening 81 is surrounded by a first electrode E1, and a second electrode E2, separated by an insulating layer 9. Electrodes E1, E2 of each plasma cell Cx are independently connected to the command unit 2. In consequence, the independent electrodes may be placed at different electrical potentials. The term "independently" here denotes the fact that each cell comprises independent electrodes E1, E2, meaning that two different plasma cells Cx, being contiguous or not contiguous do not share any common electrode. In particular, the lateral wall 71 of the plasma cells are preferably not used as electrode.

It is understood that although an example of a plasma cell arrangement is described, the present invention is not limited to this specific arrangement. For example, the gas inlet 6 may be placed on a side wall of the plasma cell.

The insulating layer 9 may be of any kind of insulating material such as dielectric polymer, ceramic or any other known material.

The lateral wall 71 of the plasma cells Cx may correspond to the global structure of the head 4. To this end, the head 4 comprises a frame 41 having several contiguous holes, each hole corresponding to a plasma cell Cx wherein the frame itself defines the lateral wall 71 of each plasma cell Cx. The frame 41 is preferably made in an insulating material so as to not conduct any voltage to the plasma cells Cx. In other words, the frame only serves as a physical structure. Alternatively, the lateral wall 71 of the plasma cells may be defined by an independent layer maintained on the frame of the head 4. This may be the case for example, when the frame 41 is made of or comprises conductive material. In that specific case, an additional insulating layer may be used to provide the lateral walls of the plasma cells Cx.

The frame 41 has a rear face and a front face, the rear face being adapted to receive the gas inlet 6 of each of the cells Cx. The gas inlet may be made in a metallic material such as stainless steel or a metallic alloy adapted to resist to corrosive and/or oxidative products. Alternatively, the gas inlet 6 may be made in a polymeric material or a mixture of polymeric material such as a polymers used in 3D printing processes. The gas inlet 6 is connected to the frame 41 by means of a connexion element 10. The connexion element allows thus to maintain the gas inlet 6 in good position at the rear end of a given plasma cell Cx. The connexion element 10 is preferably made of an insulating material. Each hole of the frame 41 is provided with a first electrode E1 at the front face. The first electrode E1 may be directly linked to the frame 41 or may be separated from the frame 41 by an insulating layer. The first layer E1 is at least partly in direct contact with the internal space of the internal chamber 7 of the plasma cell. It is however possible that the portion of the first layer E1 which is in contact with the internal space of the internal chamber 7 is coated with a protective layer (not shown), as long as the electrical potential of the first electrode E1 still provides its effects on the content of the internal chamber 7. The first electrode E1 may have the shape of a plate having the a geometrical edge adapted to the lateral wall 71 of the plasma cell and close the front end of the plasma cell. In that case, the first electrode E1 comprises a central opening through which the plasma precursor can be expelled from the internal chamber. Alternatively, the first electrode E1 may take the form of a metallic grid or any other shape adapted to apply a voltage to the internal content of the internal chamber 7. The first electrode E1 of a given plasma cell Cx is electrically isolated from the first electrode E1 of the contiguous plasma cells Cx. In addition, the first electrode E1 of each of the plasma cells is electrically insulated from the one of the contiguous plasma cells Cx by an insulating layer. The first electrode E1 of each plasma cells is individually connected to the command unit 2 so as to receive a command electrical pulse.

Each hole of the frame 41 is provided with a second electrode E2 at its front face. The second electrode E2 is electrically insulated from the first electrode E1 by means of one ore more insulating layer 9. The second electrode E2 may have the shape of a plate and being superimposed with the first electrode E1. In that case, the second electrode E2 comprises a central opening through which the plasma precursor can be expelled from the internal chamber 7. The insulating layer 9 also comprises an opening. According to a specific arrangement, the first electrode E1, the second electrode E2 and the insulating layer 9 are each provided with an opening being coincident to each other so as to provide the front opening 81 of the plasma cell Cx. Both the first electrode E1 and the second electrode E2 are in direct contact with the material contained in the internal chamber 7, at least at the level of the front opening 81 of the plasma cell Cx. It is understood here and along the present disclosure that the direct contact of the electrodes with the material contained in the internal chamber 7 denotes a situation wherein the electrical potential of the electrodes remains active toward the content of the internal chamber 7. A protective layer which has no impact on the electrical potential is thus possible. The second electrode E2 of a given plasma cell Cx may be physically spaced, and electrically isolated, from the second electrode E2 of the contiguous plasma cells Cx. In addition, the second electrode E2 of each of the plasma cells is electrically insulated from the one of the contiguous plasma cells Cx by an insulating layer. The second electrode E2 of each plasma cell is individually connected to the command unit 2 so as to receive a command electrical pulse.

According to an embodiment, the first electrode E1 of two or more plasma cells receives a common electrical potential and the second electrode E2 of these two or more plasma cells are still independent so as to receive independent ignition and stop pulses. The reverse configuration is also possible wherein the second electrode E2 of two or more plasma cells receives a common electrical potential and the first electrode E1 of these two or more plasma cells remain independent so as to receive independent ignition and stop pulses. Although the electrodes receiving a given common electrical potential may be physically and electrically independent, they are advantageously connected so as to provide a single electrode common for two or more plasma cells. Such an arrangement allows to simplify the circuitry.

The insulating layer 9 may be common to all the plasma cells of the head 4. Alternatively, the insulating layer 9 be specific from each plasma cells and independent from the insulating layer 9 of the contiguous plasma cells.

In one embodiment, the combination of the first electrode E1, the second electrode E2 and the insulating layer 9 forms the front wall 8 of the plasma cells Cx. Alternatively, the front wall 8 of the plasma cells Cx comprises in addition to the first E1 and the second E2 electrodes and the insulating layer 9 a sealing material adapted to include and maintain the mentioned components. Such a sealing material may be for example a moulded polymer, a hard or a soft polymer, an insulating polymer, or any suitable coating material. The insulating layer 9 may also cover the surface of the electrodes which is in contact with the internal chamber 7, provided that it does not negatively influences the effect of the electrical potential of the electrodes.

The first E1 and second E2 electrodes are of conductive material. They may have a thickness comprised between around 1 μm and around few mm, or around 0.05 mm and around 1 mm, preferably between 0.1 and 0.8 mm. The thickness of each of the electrodes may be for example around 0.5 mm. It should however be understood that the thickness is not so crucial as the diameter of the plasma cells for the purpose of the pixel resolution.

For the purpose of the present description, the term "contiguous" and related terms denotes the close proximity of two objects, such as the plasma cells Cx. Two contiguous plasma cells thus denote two plasma cells being in direct and immediate proximity one to another, without intermediate plasma cells in between. The term "contiguous" is thus understood as "adjacent", "close by", "beside", "neighbouring" or "bordering". The relative position of the plasma cells remains independent on their relative electrical status and electrical insulation and any other parameter.

The distance separating the front opening 81 of two contiguous plasma cells Cx is preferably below 5 mm, more preferably below 3 mm, and more preferably in the order of 1 mm or below. In a preferred arrangement, the distance separating the front opening 81 of two contiguous plasma cells Cx is preferably below 0.5 mm, or below 0.1 mm.

Depending on the needs, the plasma cells Cx may be defined by one or several of the diameter of the front opening 81, the diameter of the internal chamber 7, the diameter of the through hole 62 of the gas inlet and the height of the internal camber 7. FIGS. 4a, 4b, 4c and 4d better show the different example of possible arrangements of the plasma cells Cx.

The diameter of the through hole 62 of the gas inlet 6 may be comprised between around 0,005 mm and 0.8 mm, preferably between around 0.1 and 0.5 mm. It may be of around 0.2 mm.

Figure 4A:
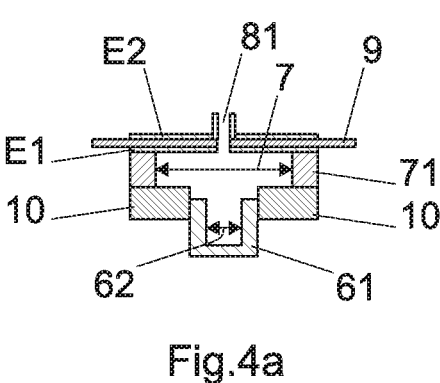
FIGS. 4*a*, 4*b*, 4*c*, 4*d*: Details of a given cell according to various embodiments.
Figure 4B:
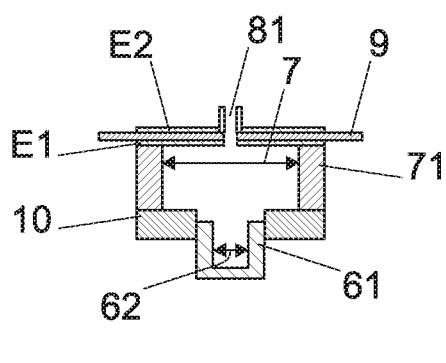

The height of the internal chamber 7, separating the gas inlet 6 from the internal face of the front wall 8, may be comprised between around 0.1 mm and around 20 mm. The internal chamber 7 may be for example of a short length, as shown in FIG. 4a. The height may in that case be in the order of around 0.1 to 0.5 mm. Alternatively, the internal chamber 7 may of a long length. In that case, its height may better be comprised between around 0.5 and 1 to 3 mm, up to 20 mm. The terms "short" and "long" length are not provided to be limited to the above dimensions and rather correspond to a tunable parameter of the plasma cells.

Figure 4C:
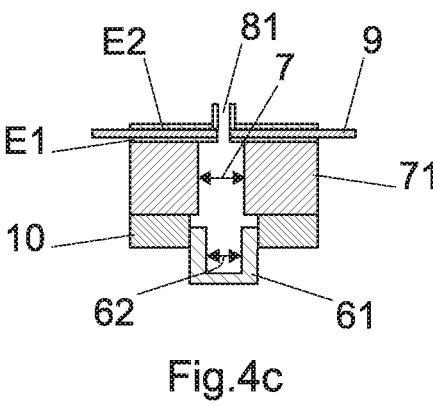
Figure 4D:
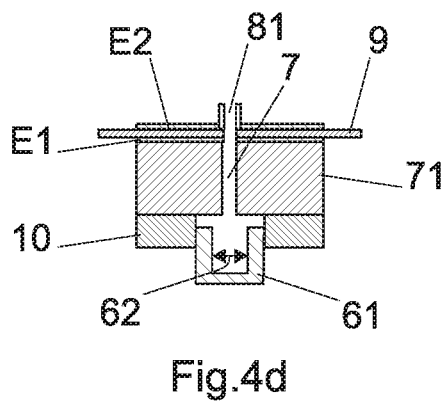

Independently on the diameter of the through hole 62 and the height of the internal chamber 7, the diameter of the internal chamber 7 may vary between a minimal value and a maximal value depending on the intensity of plasma which should be delivered to the surface M1. The diameter of the internal chamber 7 may be of the same order as the diameter of the through hole 62 of the gas inlet 6 (FIG. 4c). It may even be thinner, as shown in FIG. 4d. For example, the diameter of the internal chamber 7 may correspond to one tenth, or half or one third of the diameter of the through hole 62. Alternatively, the diameter of the internal chamber 7 may be larger than the through hole 62. It may for example correspond to the double or three times or ten times the value of the diameter of the through hole 62.

According to one embodiment, the plasma cells may be of a short length, wherein the diameter of the internal chamber corresponds to three to five times the diameter of the through hole 62.

According to another embodiment, the plasma cells may be of a long length wherein the diameter of the internal chamber corresponds to three to five time the diameter of the through hole 62.

According to another embodiment, the plasma cells may be of a short length or a long length wherein the diameter of the internal chamber is of the same order than the diameter of the through hole 62.

According another embodiment, the plasma cells may be of a short length or a long length wherein the diameter of the internal chamber corresponds to one half to one fifth of the diameter of the through hole 62.

It is understood that any other appropriate ratios between the height and the diameter of the internal chamber 7 and the diameter of the through hole 62 may be determined.

The diameter of the front opening 81 may be in the order of 0.01 mm to 1 mm depending on the desired resolution of the pattern printed on the surface. The diameter of the front opening 81 is preferably comprised between around 0.01 mm and around 0.5 mm, more preferably between 0.01 mm and around 0.3 mm, and even more advantageously between 0.01 mm and around 0.1 mm. It is noted that its diameter influences the accuracy of the plasma jet on the surface M1. The length of the front opening 81 may correspond to the thickness of the front wall 8. Alternatively, it may be longer, with a protrusion toward the outside of the corresponding plasma cell so as to better orient and guide the plasma jet on the surface M1. Although the front wall 81 may be cylindrical, with parallel side walls, it may have another geometrical shape. For example, its transversal section may be conical, wherein its extremity has a small diameter than its base, or on the contrary, wherein its extremity has a larger diameter than its base. For a better pixel definition, the plasma jet should not be spread but rather focused on a small area of the surface M1. To this end, the conditions of pressure of the incoming plasma precursor and the dimensions of the front opening 81 may be correlated properly.

For the purpose of the present disclosure, the terms "front" and "rear" applied to the plasma cell denotes the opposite faces of a given plasma cell, wherein the front end, or front face of the plasma cell corresponds to face from which is expelled the plasma, and wherein the rear face corresponds to the face at which is supplied the incoming plasma precursor. The front face of a plasma cell Cx thus faces the surface M to be treated.

The plasma device 1 according to the present disclosure allows an individual activation of the plasma cells Cx. This is possible since the electrodes of each plasma cells Cx are independent from the other plasma cells. In addition it allows the activation of the plasma cells on demand, meaning that each of the plasma cells Cx may be activated for a short period of time Tx which is in the order of few milliseconds up to several hundred milliseconds or longer. Such period of time Tx may thus be limited to 10 ms or to 100 ms or 500 ms or to one second or be comprised between 10 ms and 100 ms, or between 200 and 800 ms.

In one embodiment, a given cell Cx of the plasma device 1 may be activated for an ignition period Tx comprised between 10 ms and 500 ms or more, and deactivated at the end of this ignition period Tx for an inactive period Ux comprised between 100 and 500 ms or more.

For the purpose of the present disclosure, the terms "cell activation" and "activated cell" or any related expression denotes a state of a plasma cell Cx which receives a high voltage Vx adapted to produce a plasma Px. A plasma cell Cx is activated when it is switched on. Consequently, the terms "cell inactivation", "inactivated cell" and related expressions refer to a state of a plasma cell Cx which does not provide a plasma, due to the absence of voltage Vx. A plasma cell is inactive when it is switched off. A given plasma cell Cx thus alternatively takes one of the two states activated and inactive, depending on the absence or the presence of a high voltage applied to the corresponding first E1 and second E2 electrodes.

The high voltage Vx denotes a voltage suitable for transforming a plasma precursor into an actual plasma. It may be of the order of 800 Volts or 1000 volts or 2000 volts or higher depending on the parameters such as the pressure, the nature of the plasma precursor, the distance between the first E1 and second E2 electrodes and the flow rate. When the pressure is sufficiently low, a voltage Vx as low as around 100 Volts may be applied. One thus understands that, depending on the applied parameters, a voltage Vx comprised between around 100 Volts and more that 2000 volts can be used.

The activation period of the plasma cells Cx may last less than few seconds, even less than one second, preferably less than 100 ms, such as 10 to 50 ms. So breve activation of the plasma cells allow a good pixel definition. A cycle of activation and inactivation may last for example of the order of one second or two seconds. In other words, the ignition frequency is of the order of one second or higher. High voltage application at so high frequencies necessitates an adequate command unit 2 adapted to achieve these performance and to avoid material damages.

Figure 5:
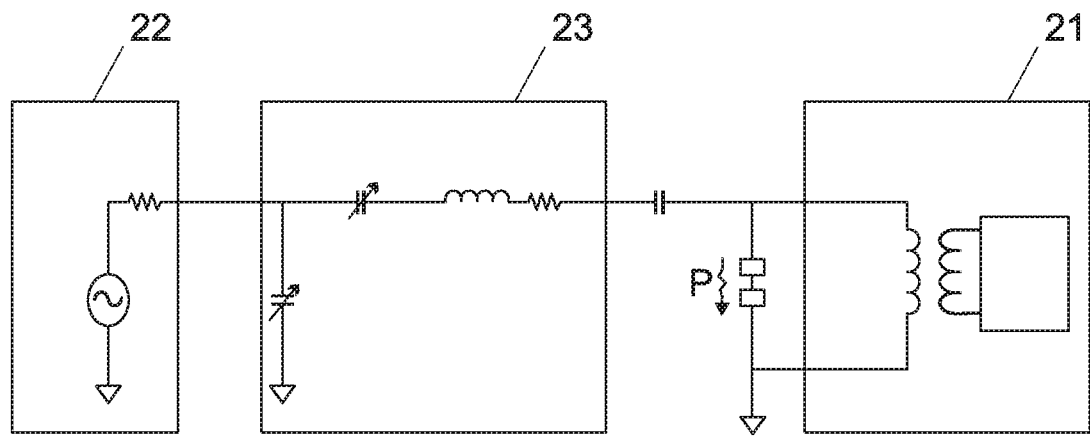
FIG. 5: Schematic view of the command unit.

The command unit 2 of the present plasma device is represented by FIG. 5. It comprises a high voltage generator 21 adapted to provide short pulses of high voltage. The high voltage generator 21 preferably provides pulses of high DC voltage. It is thus understood as being a high voltage pulse generator. The pulse duration is better described below. The high voltage DC generator 21 may comprise several units providing high DC voltage and arranged in parallel. The number of such units may be as high as 100 or more. Each of these DC voltage units occupies a volume of less than 50 cm³, preferably less than 30 cm³ so that the high voltage DC generator 21 remains enough compact. Each of the DC voltage units preferably consumes less than 10 watts and provides a voltage of the order of 2000 Volts. Each of the High voltage units is connected to a different plasma cell. DC means here very low frequency pulses from DC to a few hundred Hertz. The DC may thus oscillate slightly. It is however considered as direct current for the timeframe of the pulse.

The command unit 2 further comprises a radiofrequency generator (RF) 22. The RF generator 22 may produce a radiofrequency at around 13 MHz to 15 MHz, like around 13.56 MHz. Such a RF generator 22 allows to maintain the plasma Px of the plasma cells Cx active once the corresponding plasma cell Cx has been switched on.

While the RF generator 22 is permanently active, the High Voltage DC generator 21 supplies high voltage to the plasma cells Cx on demand.

The RF generator 22 and the high voltage DC generator 21 are distinct elements of the command of the plasma. They are mutually protected from each other by one or several filtering elements 23. The filtering elements 23 protects the high voltage DC generator 21 from the RF generator 22. The filtering elements 23 protects the RF generator 22 from damages due to the high voltage DC generator 21. Furthermore, the filtering elements 23 also protects the RF generator 23 from interferences. In particular, the filtering elements 23 comprises a matching unit which assures the best adaptation of the impedance of the plasma circuit to the impedance of the RF generator unit 22. This matching unit makes sure that the output power of the RF generator is most efficiently coupled into the plasma itself. The output power of the RF-generator depends on the number of activated cell. The higher the number of activated cells is, the higher the power from the RF generator 22 should be. This power dependence of the RF-output is assured and managed by the control unit 2 as well.

The command unit 2 here described may be fully integrated to the plasma device 1 above described and permanently connected to the plasma cells Cx. Alternatively, the command unit 2 may be independent from the plasma cells Cx. In this particular case, the plasma device 1 comprises a frame 41 of plasma cells Cx as described above and a separate command unit 2 which can be connected to, or disconnected from, the plasma cells Cx. To this end, the frame 41 or any other suitable part of the plasma device 1 is provided with the necessary electrical plug (not represented) allowing to connect the electrodes of the plasma cells to the command unit 2. The command unit 2 comprises the necessary connection means to plug the plasma cells.

According to an embodiment, the command unit 2 can be adapted to different plasma cells arrays. For example, the number of units of the high voltage DC generator 21 may be adapted according to the number of plasma cells to be controlled. In addition, the power of the RF generator 22 is modulated or adapted according to the needs. The command unit may comprise the suitable software allowing the user to modulate at least the power of the RF generator 22.

The radiofrequency generator 22 is arranged to feed all the plasma cells Cx together by mean of an adapted switching device. While all the plasma cells Cx are fed by the radiofrequency generator 22, each one of the plasma cells Cx can individually be activated or inactivated through high voltage DC generator 21.

The command unit 2 may in addition comprise or be connected to one or several human machine interfaces such as display and keyboard. It may in addition comprise programmes adapted to execute the printing of pieces.

Figure 6:
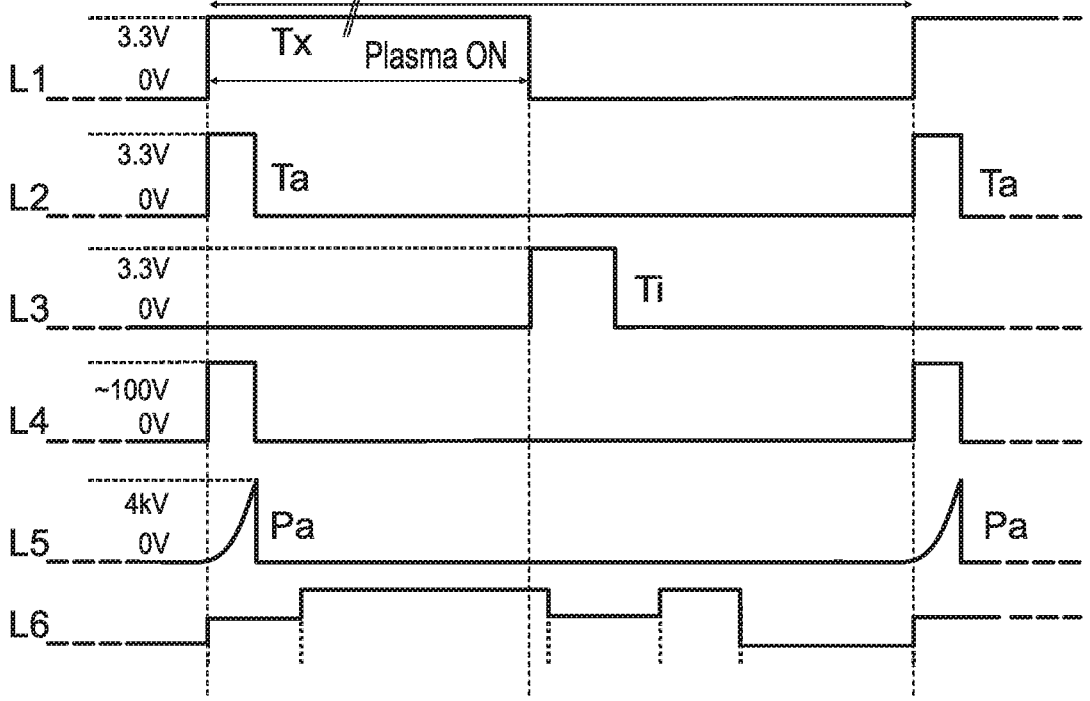
FIG. 6: Schematic diagram of the pulse command.

FIG. 6 shows an example of the command of the plasma cells Cx of the present plasma device 1. The first line L1 shows the activation cycle of a plasma cell, wherein Tx denote the ignition duration of the plasma cell. Tx may be comprised between around 10 ms and 1 second or 2 seconds. It may be for example around 500 ms.

Line L2 shows the activations pulses Ta applied from the command bus. The voltage is low, around 3.3 Volts. The pulse duration is around 50 μs. The line L4 shows the corresponding activation pulse of the high voltage DC unit. By this way, the high voltage DC unit is used only to initiate the plasma ignition. The RF generator is active along the ignition period Tx.

To switch off the plasma cell Cx, a deactivation pulse Ti is initiated to the RF generator 23 as shown at the line L3. The line L6 shows the profile of the RF output power when several plasma cells are successively activated and deactivated.

The present disclosure further describes a process for efficiently marking manufactured objects M with local 2D representations. The present process comprises in particular the step of placing the surface M1 close to the plasma cells Cx of the plasma device 1. The distance between the surface M1 and the plasma cells may be for example of around 0.3 to around 3 mm.

The present process also comprises the step of independently activating the plasma cells Cx of the plasma device 1. Each plasma cell is activated according to the above described method.

The activation of the plasma cells may be performed while the manufactured object M and the head 4 of the plasma device are fixed one with regard to the other.

Alternatively, an optional step of moving the manufactured object M with regard to the head 4 of the plasma device 1, either in one direction or in two planar directions, can be performed while the plasma cells are activated.

The marking process results in a local 2D marking M2 on the surface M1, wherein the surface properties of the marked area differs from the properties of the unmarked surface.

REFERENCE NUMBER ON THE DRAWINGS

1 Plasma device
2 Control unit
3 Plasma precursor unit
31 Pipe
4 Head
41 Frame
6 Gas inlet
61 Core
62 Through hole
7 Internal chamber
71 Lateral wall
8 Front wall
81 Opening
9 Insulating layer
10 Connexion element
Cx Plasma cell
Px Plasma at a given cell x
Tx Ignition period at a given cell x
Vx Voltage applied to a given cell x
Ux Inactive period of a given cell x
M Manufactured object
M1 Surface of the manufactured object
M2 Treated surface
E1, E2 Electrodes

The invention claimed is:

1. Plasma device comprising at least two plasma cells, each plasma cell having a gas inlet comprising a through hole and a core, an internal chamber defined by a lateral wall, and a front wall having a front opening, said gas inlet being connected to a plasma precursor unit, and said front wall comprising a first electrode and a second electrode separated by an insulating layer, the plasma device further comprising a command unit, wherein the first and the second electrodes of a given plasma cell are independent from the corresponding first and second electrodes of the contiguous plasma cells and wherein the first and the second electrodes are independently connected to the command unit and wherein the command unit comprises a high voltage pulse generator and a radiofrequency generator, wherein said high voltage pulse generator and radiofrequency generator are both mutually protected by one or several filtering elements.

2. The plasma device according to claim 1, wherein the plasma cells are arranged in a frame and wherein the distance separating the front opening of two contiguous plasma cells is less than 1 mm.

3. The plasma device according to claim 2, wherein the diameter of the through hole is comprised between around 0.005 mm and 0.8 mm.

4. The plasma device according to claim 2, wherein the height of the internal chamber is comprised between around 0.1 mm and around 20 mm.

5. The plasma device according to claim 1, wherein the diameter of the through hole is comprised between around 0.005 mm and 0.8 mm.

6. The plasma device according to claim 5, wherein the height of the internal chamber is comprised between around 0.1 mm and around 20 mm.

7. The plasma device according to claim 1, wherein the height of the internal chamber is comprised between around 0.1 mm and around 20 mm.

8. The plasma device according to claim 1, wherein the diameter of the internal chamber corresponds to three to five times the diameter of the through hole or is of the same order as the diameter of the through hole, or corresponds to one tenth, or half or one third of the diameter of the through hole.

9. The plasma device according to claim 1, wherein the output power of the radiofrequency generator depends on the number of activated plasma cells and wherein said one or more filtering elements comprise a matching unit which assures adaptation of the impedance of the plasma circuit to the impedance of the radiofrequency generator unit.

10. The plasma device according to claim 1, wherein the power dependence of the radiofrequency output is managed by said command unit.

11. The plasma device according to claim 1, wherein said high voltage pulse generator comprises several high voltage DC units, the number of which corresponds to the number of the plasma cells.

12. The plasma device according to claim 1, wherein high voltage pulse generator independently activates one or more plasma cells upon an activation pulse, and wherein the radiofrequency generator maintains the ignition of the plasma.

13. The plasma device according to claim 1, wherein activated plasma cells are inactivated upon a deactivation pulse.

14. Process for treating a surface of a manufactured product, said process comprising the steps of
   placing the surface close to the plasma cells of the plasma device, as claimed in claim 1, and
   independently activating the plasma cells of said plasma device, so as to provide a local 2D marking on the surface.

15. The process according to claim 14, wherein the surface of the manufactured product is treated inline, either through a continuous flow or step-by-step.

16. A command unit adapted for individually controlling the plasma cells of a plasma cell array, said command unit comprising a high voltage pulse generator, a radiofrequency generator, wherein said high voltage pulse generator and radiofrequency generator are both mutually protected by one or more filtering elements and a connexion means adapted to plug said plasma cell array.

17. The command unit according to claim 16, wherein said high voltage pulse generator comprises several units, the number of which can be adapted according to the number of plasma cells to be controlled.

18. The command unit according to claim 17, wherein said units of the high voltage pulse generator are independently activated and deactivated.

19. The command unit according to claim 16, further comprising a switching device adapted to feed all said plasma cells together with said radiofrequency generator.

* * * * *